United States Patent [19]

Tavrow et al.

[11] Patent Number: 5,034,608

[45] Date of Patent: Jul. 23, 1991

[54] INFRARED SENSOR OPERABLE WITHOUT COOLING

[75] Inventors: Lee S. Tavrow, Somerville; Anita M. Flynn, Arlington; Rodney A. Brooks, Lincoln, all of Mass.

[73] Assignee: Massachusetts Institute of Technology, Cambridge, Mass.

[21] Appl. No.: 404,732

[22] Filed: Sep. 8, 1989

[51] Int. Cl.$^5$ .............................................. G01J 5/00
[52] U.S. Cl. ............................... 250/338.3; 250/338.1
[58] Field of Search ............................ 901/1, 46, 47; 357/24 LR, 28, 30 B, 30 G, 30 E; 250/338.2, 338.4, 333, 211 J, 211 R, 334, 332, 338.1; 25/338.3

[56] References Cited

U.S. PATENT DOCUMENTS

| | | | |
|---|---|---|---|
| 3,604,933 | 9/1971 | Cross | 250/338.2 X |
| 3,629,585 | 12/1971 | Desvignes et al. | 250/349 X |
| 3,846,820 | 11/1974 | Lampe et al. | 357/31 |
| 4,106,046 | 8/1978 | Nathanson et al. | 357/30 |
| 4,115,692 | 9/1978 | Balcerak et al. | 250/338.8 |
| 4,258,259 | 3/1981 | Obara et al. | 250/338.3 |
| 4,418,335 | 11/1983 | Genähr | 340/565 |
| 4,558,342 | 12/1985 | Sclar | 357/30 |
| 4,651,001 | 3/1987 | Harada et al. | 250/330 |
| 4,682,032 | 7/1987 | Barrett | 250/352 |
| 4,737,642 | 4/1988 | Steil et al. | 250/332 |
| 4,764,244 | 8/1988 | Chitty et al. | 156/630 |
| 4,827,133 | 5/1989 | Zierhut | 250/338.4 |
| 4,831,257 | 5/1989 | McClelland et al. | 250/338.1 |
| 4,897,547 | 1/1990 | Iwasa et al. | 250/338.1 |
| 4,902,894 | 2/1990 | Butler et al. | 250/338.1 |
| 4,916,505 | 4/1990 | Holm-Kennedy | 357/43 |

FOREIGN PATENT DOCUMENTS

0237250 3/1987 Fed. Rep. of Germany .
62-147388 7/1987 Japan .............................. 250/338.3

OTHER PUBLICATIONS

DeWeerth and Mead, "A Two-Dimensional Visual Tracking Array", Proceedings of the MIT Conference on VLSI, May 1988, Available from the MIT Press.
McCharles and Hodges, "Charge Circuits for Analog LSI", IEEE Transactions on Circuits and Systems, vol. CAS-25, Jul. 1988, pp. 490–497.
Budd et al., "Sol-GEl Processing of PbTiO$_3$, PbZro$_3$, PZT and PLZT Thin Films" British Ceramics Proceedings, vol. 36, 1985, pp. 107–121.
Beni et al., "Swarm", Intelligence in Cellular Robotic Systems:, NATA Workshop on Robotics in Biological Systems, Tuscany, Italy, Jun. 13, 1989.
Bondurant et al., "Ferroelectrics for Nonvolatile RAMs" IEEE Spectrum, Jul. 1989, pp. 30–33.
Brooks et al., "Fast, Cheap and Out of Control: A Robot Invasion of the Solar System", MIT AI Memo, Jun. 15, 1989.
Eltec Instruments, Inc. "Introduction to Infrared Pyroelectric Detectors", Jun., 1986, Daytona, Fl.
Flynn, "Gnat Robots (And How They Will Change Robotics)", IEEE Micro-Robots Teleoperators Workshop, Hyannis, MA, Nov., 1987.
Flynn, "Gnat Robots", AI Expert, Dec., 1987, pp. 34–42.

(List continue on next page.)

*Primary Examiner*—Constantine Hannaher
*Assistant Examiner*—Edward J. Glick
*Attorney, Agent, or Firm*—Fish & Richardson

[57] ABSTRACT

An infrared sensor operable without cooling and thus usable at room temperature comprises a substrate supporting thin films of pyroelectric material and switched capacitor control circuitry. The control circuitry compares the absolute capacitance of a reference thin film to that of a sensor thin film, thereby sensing infrared radiation without the use of a chopper device. The reference thin film is thermally coupled to the substrate, and the sensor thin film is thermally insulated form the substrate. To increase the fill factor, the sensor thin film is placed directly above the control circuitry. In another apsect, the sensor is adpated to sense visible and infrared light by adding a CCD sensor and appropriate control circuitry to the substrate.

11 Claims, 3 Drawing Sheets

Flynn et al., "MIT Mobile Robts—What's Next?", IEEE Robotics and Information Conferences, Philadelphia, PA, Mar., 1988.

Pennwalt, Inc., "Technical Manual for 'Kynar Piezo Film'", King of Prussia, PA.

Viggh et al., "Infrared People Sensors for Mobile Robots", SPIE vol. 1007, Mobile Robots III, Nov. 1988, Cambridge, MA, pp. 391–398.

Petersen, "Silicon Sensor Technologies", Technical Digest of the IEEE International Electron Devices Meeting, Washington, Dec. 2–7, 1985.

Ramtron, Inc. Corporate Technical Report on "Nonvolitile Ferroelectric Technology and Products", Colorado Springs, CO.

INFRARED SENSOR OPERABLE WITHOUT COOLING

BACKGROUND OF THE INVENTION

This invention relates to optical sensors, and particularly to room temperature infrared sensors especially applicable to miniature robots ("gnat robots").

To operate properly, a robot most often requires sensing of its proximity. Therefore, known robot designs use sonar rangefinders, active near-infrared proximity sensors or laser light-striper imaging systems to endow them the capability of roaming freely through their environments, avoiding obstacles, and searching for specified landmarks or goals. These proximity sensors are active—they emit energy to the environment.

Known passive cameras are made from solid-state charge coupled devices. These devices are sensitive to visible light, and are commonly used by vision researchers to develop algorithms for image understanding. In robotics, visible light vision systems have had success, but have not achieved full image recognition owing to the incredible complexity of everyday visible-light scenes where objects have shadows, are obscured by other objects, and may blend into the background. Human eyesight is clearly our most complex sense, requiring close to half of our actual brain volume to function. Furthermore, our eyes require high bandwidth to the brain even after greatly preprocessing the visual information in the retina. Instilling human level perception into a robot is a very difficult task.

Infrared imaging, on the other hand, promises much better image recognition for certain objects while requiring only a fraction of the computing power of visible light vision. Edges in an infrared image will be primarily outlines of a single body, free from any extraneous edges due to texture or optical patterns. Most objects, and especially animate objects, tend to have a characteristic temperature which is invariant and distinct from the background temperature in nearly all conditions. Imaging systems that are sensitive to temperature can thus easily spot these objects and recognize them from their temperature.

Typical silicon infrared imagers, such as charge coupled device sensors designed for long wavelength electromagnetic energy, need to be cooled to the temperature of liquid nitrogen. This is because long wavelength photons have less energy than visible light, and the signals detected from these photons are below the CCD noise floor unless the sensor is cooled.

Pyroelectric substances have a polarized crystalline structure in which changes magnitude (inducing charge) when exposed to heat (i.e. infrared radiation). Pyroelectric sensors, therefore, can detect infrared radiation. Silicon sensors, by contrast, create charge carriers when hit by long wavelength photons. The main advantage of a pyroelectric sensor is that it does not need to be cooled.

Of the thirty-two different crystal classes, twenty-one have lattice formations with an inherent asymmetry. Twenty of those twenty-one crystals exhibit piezoelectric properties, which means that application of a voltage across the material causes a mechanical deformation and, conversely, stressing the material produces an electrical signal.

Of the twenty substances that have piezoelectric attributes, ten contain an electric dipole moment in the unstrained condition, which leads to pyroelectric characteristics. A pyroelectric material creates an electrical signal when the crystal is exposed to a change in temperature. Some of the ten pyroelectric materials also display ferroelectric traits. A ferroelectric material can have its polarization dipole reoriented in direction through the application of a strong electric field. After the electric field is removed, the crystal retains the polarization direction, effectively acting as a solid-state switch. Ferroelectrics, then, being a subset of pyroelectrics and piezoelectrics, contain all the attributes of all three. In addition, ferroelectric materials are characterized by having very high dielectric constants.

Because of their heat sensitivity, pyroelectric or ferroelectric materials may be used to sense infrared energy. Pyroelectric infrared imaging array cameras are commercially available, but are expensive. The cost of these cameras stems from a complex manufacturing technique The ceramic crystals for the pyroelectric arrays are assembled by hand, ground down manually to 20 $\mu$m thickness, diced into small cells, and bump-mounted onto a hybrid substrate.

Typical pyroelectric camera readout circuitry senses the current (the change in charge) produced by the ceramic crystals. However, in a pyroelectric, a change in charge is produced by change in temperature, hence a pyroelectric camera needs relative motion of the infrared image to produce any signal. To solve this problem, a mechanical chopper is placed in front of the pyroelectric sensor to artificially produce temperature changes in static images.

SUMMARY OF THE INVENTION

In a first aspect, the invention features a thin film pyroelectric infrared imaging sensor operable without cooling, and thus capable of room temperature operation. The sensor is manufactured by depositing a thin film of pyroelectric material on a semiconductor substrate. The invention requires no cooling because a pyroelectric effect is utilized.

In preferred embodiments, a reference sensor and highly stable switched capacitor analog circuitry are incorporated into the sensor substrate; the analog circuitry is thermally isolated from the sensor by a thermally insulating layer such as a glass; a small opening in the insulating layer is provided to connect the sensor to the circuitry; switched capacitor circuitry compares the absolute capacitance of the sensor sites to that of the reference sensor, thereby allowing a static image to be produced without image chopper devices. In other preferred embodiments, the control circuitry is placed under the pyroelectric sensor film, thus allowing a chip fill factor approaching 100%.

In a second aspect, the invention features a combination infrared and visible-light room-temperature camera including a pyroelectric sensor array as set forth above in combination with a second sensor array located in the same substrate. In preferred embodiments, the second sensor is a CCD sensor, and the control circuitry for both sensor arrays is under the pyroelectric film, thus allowing the fill factor for the combination sensor to approach 100%.

Other advantages and features of the invention will be apparent from the following description of the preferred embodiment and from the claims.

All of the figures are somewhat diagrammatic and are not drawn to scale.

DESCRIPTION OF THE PREFERRED EMBODIMENT

Figure 1A:
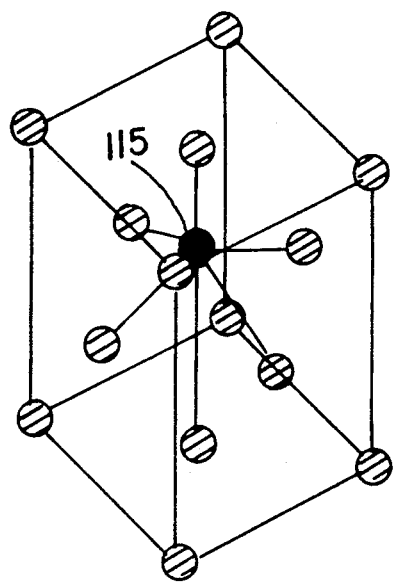
FIGS. 1A and 1B illustrate the crystal structure of dielectric crystals.
Figure 1B:
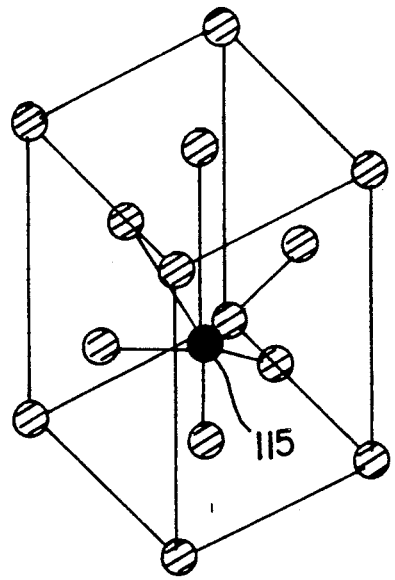

One ferroelectric material with a very high piezoelectric coefficient is lead zirconium titanate, otherwise known as PZT. Referring to FIGS. 1A and 1B, the crystal structure of PZT contains inherent asymmetries in its lattice (caused by the bistable location of Pb, Zr, and Ti ions). For illustrative purposes, two bistable states of the central atom in the PZT lattice are depicted in FIG. 1A and FIG. 1B, respectively.

Figure 2:
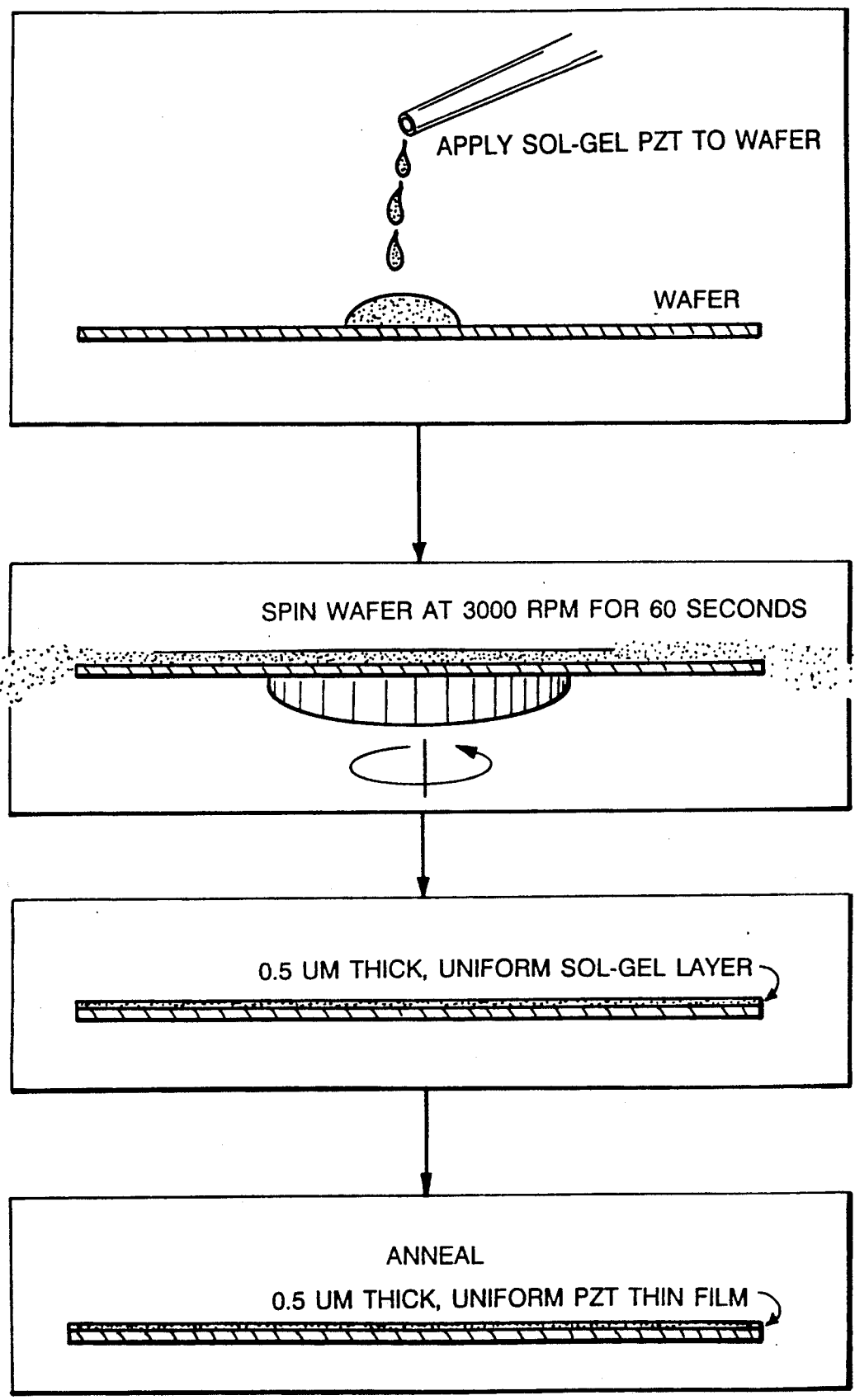
FIG. 2 depicts a PZT thin film process.

FIG. 2 illustrates a sol-gel process for creating crack-free thin films of PZT from 6,000 angstroms to 1.2 microns thick. In this process a slurry of PZT is spun onto a wafer to a desired thickness, and then annealed at high temperature to form the crystalline lattice. After the anneal, the material is poled to induce the desired piezoelectric properties. Further details on the processing of PZT thin films can be found in Budd et al. "Sol-Gel Processing of PbTiO$_3$, PbZrO$_3$, PZT, and PLZT Thin Films", British Ceramics Proceedings, Vol. 36:1985, pages 107–121, incorporated by reference herein.

Robots and other electrical and electro-mechanical devices need sensors in order to interact with their environment. Infrared sensors have many advantages for image recognition. Some conventional infrared sensors use a cooled CCD. However, cooling conventional CCD infrared sensors is not practical in low power applications, such as gnat robots.

According to the invention, to avoid cooling, dielectric films are used as static, room temperature infrared sensors. The sensors are produced by a VLSI process, and are combined with conventional VLSI circuitry for sensing and processing the signals from the sensor sites.

To use dielectric material in conjunction with standard silicon processes, potential contamination and thermal problems are dealt with. The three major effects of impurities which can ruin MOS transistors are: high electron-hole recombination rates due to deep-level donor impurities, voltage threshold shifts due to mobile ion impurities in gate oxides, and large interface charges due to surface contamination. Some materials that cannot be present during MOS transistor fabrication are, for example, gold, copper, iron, and zinc, which are deep level donors, and sodium, potassium, and lithium, which are mobile ions in oxides. If present during deposition or thermal growth of thin films, these materials and others will also cause excessive interface charges and in extreme cases, fermilevel pinning (which will destroy MOS transistor action).

Many processing steps can be also be ruined by later steps that use high temperatures. For instance, it is desirable to dope the source and drain regions of small MOSFETs to only very shallow levels, but subsequent processing steps may require high temperatures which will inadvertently cause the doped junctions to diffuse to deeper levels. To prevent these junctions from diffusing inappropriately, the wafer cannot be exposed to temperatures above 800° C. for any length of time. In addition, high temperature cycling of wafers tends to both reduce mobilities and overstress wafers, affecting transistor yield and performance.

Unlike cross-contamination issues, thermal management problems do not prevent mechanical and device wafers from being processed in the same lab using the same equipment. This allows for sharing of resources which is very helpful in reducing expenses. Wafers containing films that could possibly contaminate the normal fabrication procedures can be protected or passivated with special layers. Finally, special layers can be applied on top of fabricated transistors and the wafers removed to a separate fabrication laboratory with a much reduced subset of equipment for final processing.

The sensing circuitry for the dielectric sensor makes use of switched analog circuit techniques, measuring the very small, heat-related capacitance changes of the dielectric film. The dielectric constant $\epsilon$ of the films, and thus the measured capacitance, is a strong function of temperature. To enhance the sensitivity of $\epsilon$ to temperature, the sensors may use a ferroelectric film which has a composition close to, but just above, its Curie temperature $T_c$ at ambient temperature. In ferroelectrics close to $T_c$, $\delta\epsilon/\delta T$ reaches very high values. In one embodiment of the invention, the ferroelectric material is PZT.

Other, secondary effects may also affect the measured capacitance. For example, temperature dependent volumetric changes of the sensor material may cause capacitance changes. These secondary effects may be used to enhance the primary dielectric effects, or may need to be removed from the sensor through calibration.

Accuracy in the sensor circuitry is maintained by automatic calibration and noise cancellation. By measuring the actual capacitance of the dielectric film, as opposed to the currents produced from the sensors, a static infrared picture is generated by the sensor, eliminating the need for a chopper device.

Common mode noise is also reduced through the use of a fully differential op-amp and careful circuit design.

Because the sensor sites can be manufactured directly over the sensor circuitry, the "fill factor" (i.e. the percentage of the chip area containing sensing sites) is improved over known CCD sensors. In silicon CCD sensors, part of the chip surface area must be devoted to silicon sensor sites, because the sensors are diffusion areas in the substrate. This means that a CCD sensor has a fill factor of much less than one, leading to below optimal sensor resolution.

The sensing requirements of a gnat robot may not be completely fulfilled by a infrared sensor. Therefore, the gnat robot is also provided with a visible light sensor, and simple algorithms, for example, optical flow algorithms, are used to control the robot to avoid objects.

Ideally, an infrared system would be coupled to a visible-light system, the strengths of one system being used to complement the other. If CMOS compatibility is essential, the visible light sensors may use photo transistors, implemented by the parasitic bipolar capacitors which are formed naturally in a CMOS process. Examples of sensors of this type can be found in "A Two-Dimensional Visual Tracking Array" by Stephen P. De-Weerth and Carver A. Mead, Proceedings MIT Conference on VLSI, 1988, available from the MIT Press and incorporated by reference herein in its entirety.

In preferred embodiments, the visible light sensor sites take up approximately half of the chip area, and the processing circuitry transistors for both the visible and infra-red sensors take up the other half. A thin dielectric film is then deposited directly over the processing circuitry transistors, thus utilizing the second half of the chip for infra-red sensor sites. In these embodiments, the fill factor of the chip approaches 100%; 50% of the chip senses visible light and 50% senses infra-red. Note that, in these embodiments, no more silicon area is used than that required by a conventional visible-light sensor with no sensor sites over the transistors.

Figure 3:
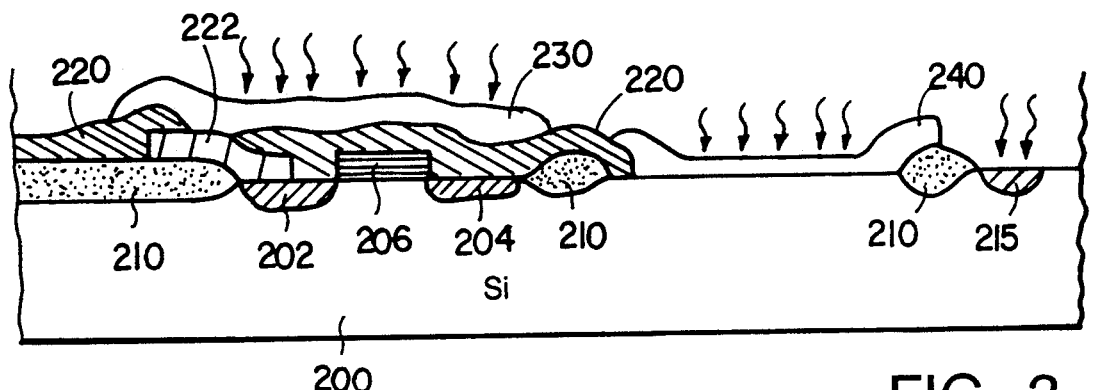
FIG. 3 is a cross-sectional view of a dielectric infrared sensor according to the invention.

FIG. 3 shows one embodiment of a combination infrared and optical sensor. The sensor is formed on a silicon substrate 200, in accordance with standard MOS processing. MOS transistor sources 202, drains 204, and gates 206 are grown and deposited on the substrate, along with field oxide 210. At the same time, diffusion area 215 is introduced, creating a CCD visible-light sensor. The MOS transistor 202, 204, 206 then insulated by a thermally insulating glass 220 (or another insulator such as an Aerogel), which prevents the thermal behavior of the MOSFET from influencing the signal from the sensor 230 which overlays it. The MOSFET is connected to the sensor 230 by a small strip of metallization 222, which connects to the sensor 230 through a small opening in the insulator 220. The small size of the opening limits the thermal interaction of the MOSFET and the sensor 230. A reference sensor 240 is formed in direct contact with the substrate.

In operation, sensors 230, 240 and diffusion area 215 are exposed to light. The capacitance of the sensor 230 is compared to the reference capacitance of thermally grounded (i.e. in direct contact to the substrate) sensor 240, and the difference signal is processed by switched capacitor amplifiers.

Figure 4:
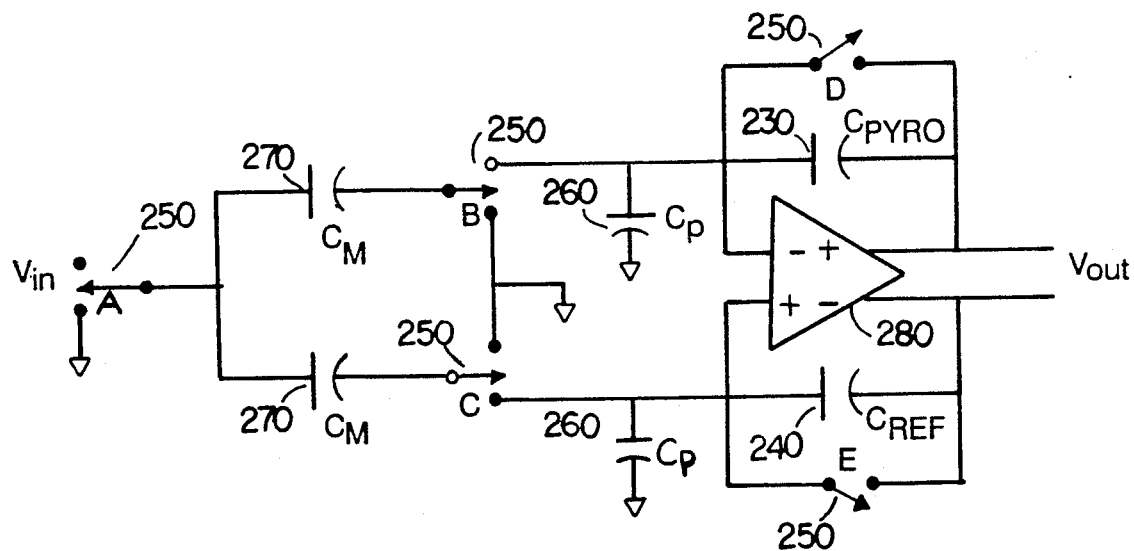
FIG. 4 is a circuit diagram of a switched capacitor circuit for amplifying the signal of the dielectric sensor of FIG. 3.

FIG. 4 shows a suitable switched capacitor amplifier circuit. The capacitances $D_{PYRO}$ 230 and $C_{REF}$ 240 are compared by an op-amp 280 (implemented by MOS transistors) and switched capacitors. The circuit comprises an input voltage source $V_{IN}$, switches 250, parasitic capacitances $C_P$ 260 (formed naturally from the substrate capacitances of the various diffusion regions tied to the '+' and '−' nodes of the op-amp), and matched input capacitors $C_M$ 270. To enhance the accuracy of the circuit, as discussed below, the input capacitors $C_M$ are exactly matched to each other, and the parasitic capacitors $C_P$ are also exactly matched to each other.

To auto-zero the offset of op-amp 280, switches D and E are closed, and switches A, B, and C are grounded. This zeros the voltage on the input capacitors $C_M$ 270 and the signal capacitors $C_{PYRO}$ 230 and $C_{REF}$ 240, and also drives the offset voltage of op-amp 280 onto the parasitic capacitors $C_P$ 260.

After auto-zeroing the circuit, to compare $C_{PYRO}$ and $C_{REF}$, switches D and E are opened, switches B and C are connected to the '+' and '−' inputs of op-amp 280, and switch A is connected to the input voltage $V_{IN}$ (typically 1 to 5 volts). Input capacitors $C_M$ 270 then charge to a voltage near $V_{IN}$ by drawing charge off of parasitic capacitors $C_P$ 260 and signal capacitors $C_{PYRO}$ 230 and $C_{REF}$ 240. The majority of the charge drawn onto input capacitors $C_M$ is drawn off of capacitors $C_{PYRO}$ 230 and $C_{REF}$ 240 because they have capacitance values much larger than those of the parasitic capacitors $C_P$. In addition, because the capacitance values of the input capacitors $C_M$ and the parasitic capacitors $C_P$ are very closely matched, the charge drawn off of capacitors $C_{PYRO}$ and $C_{REF}$ will be substantially equal. If there are differences in the capacitance of $C_{PYRO}$ and $C_{REF}$ (caused by infrared radiation received by the sensor site), however, when equal amounts of charge are drawn off of $C_{PYRO}$ and $C_{REF}$, the resulting voltages on the two capacitors will not be equal. Therefore, the output voltage from op-amp 280 will be directly proportional to the difference in capacitance of $C_{PYRO}$ and $C_{REF}$, and will be indicative of the infrared radiation received by the associated sensor site.

The gain of the circuit is a function of the ratio of the capacitances $C_M$ and the difference between $C_{PYRO}$ and $C_{REF}$. This gain will ordinarily be less than one, and thus the output of the circuit will need to be followed by additional amplification stages. However, because the signals have low-level voltage swings (smaller than 1 volt), very accurate MOS op-amp designs may be implemented to amplify the difference signal. The accuracy of the circuit will also be affected by the matching of the channel "charge pumping" of the MOS switches 270 in use. This factor can be controlled by careful circuit design and matching of the geometry of the devices.

Further discussion of the design and implementation of high-precision switched capacitor circuits can be found in "Charge Circuits for Analog LSI" by Robert H. McCharles and David A. Hodges, IEEE Transactions on Circuits and Systems, Vol. CAS-25, July 1978, pg. 490–497, incorporated by reference herein.

OTHER EMBODIMENTS

Other embodiments are within the scope of the following claims. For example, the sensor may be fabricated by techniques other than those described above.

What is claimed is:

1. An infrared sensor comprising
   a supporting substrate,
   a thermally insulating layer formed on said substrate,
   a sensor thin film comprising pyroelectric material formed on said thermally insulating layer and thermally insulated from said substrate,
   a reference thin film comprising pyroelectric material thermally coupled to said substrate, and
   pyroelectric signal sensing circuitry for comparing the capacitance of said reference thin film and said sensor thin film.

2. The sensor of claim 1 wherein said pyroelectric signal sensing circuitry is formed in said substrate.

3. The sensor of claim 2 adapted for infrared and visible light detection, further comprising
   a visible-light sensor comprising a charge coupled device formed in said substrate, and
   CCD signal sensing circuitry formed in said substrate for detecting and amplifying electric signals from said visible-light sensor,
   wherein said thermally insulating layer and said sensor thin film are disposed over said pyroelectric and CCD signal sensing circuitry, whereby the fill factor of said sensor is increased.

4. The sensor of claim 3 wherein said pyroelectric signal sensing circuitry is connected to said sensor thin film through an opening in said thermally insulating layer.

5. The sensor of claim 1 or 3 wherein said sensor thin film and said reference thin film comprise lead zirconium titanate thin films.

6. The sensor array of claim 1 or 3 wherein said thermally insulating layer is an Aerogel.

7. A combination infrared and visible light room-temperature sensor array comprising
- a supporting semiconductor substrate,
- a thermally insulating layer formed on said substrate,
- an array of infrared-light sensor thin films comprising pyroelectric material formed on said thermally insulating layer and thermally insulated from said substrate,
- an array of visible-light sensors comprising charge coupled devices formed in said substrate, the charge coupled devices of said second array interleaved on the surface of said substrate with the pyroelectric thin films of said first array, and
- sensing circuitry formed in said substrate for detecting and amplifying electric signals from said infrared and visible-light sensors.

8. The sensor array of claim 7 wherein said thermally insulating layer and said infrared-light sensor thin films are disposed over said sensing circuitry, whereby the fill factor of said sensor array is increased.

9. The sensor array of claim 7 or 8 wherein said sensor thin films comprise lead zirconium titanate thin films.

10. The sensor array of claim 7 or 8 wherein said sensing circuitry is connected to said sensor thin films through openings in said thermally insulating layer.

11. The sensor array of claim 7 or 8 wherein said thermally insulating layer is an Aerogel.

* * * * *